(12) United States Patent
Wang et al.

(10) Patent No.: US 7,834,524 B2
(45) Date of Patent: Nov. 16, 2010

(54) MICRO-ELECTROMECHANICAL DEVICES HAVING VARIABLE CAPACITORS THEREIN THAT COMPENSATE FOR TEMPERATURE-INDUCED FREQUENCY DRIFT IN ACOUSTIC RESONATORS

(75) Inventors: Ye Wang, Cupertino, CA (US); Harmeet Bhugra, San Jose, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 12/404,830

(22) Filed: Mar. 16, 2009

(65) Prior Publication Data
US 2010/0194499 A1    Aug. 5, 2010

Related U.S. Application Data

(63) Continuation-in-part of application No. 12/393,566, filed on Feb. 26, 2009, which is a continuation-in-part of application No. 12/363,142, filed on Jan. 30, 2009.

(51) Int. Cl.
*H01L 41/08* (2006.01)
*H03H 9/13* (2006.01)
*H03H 9/15* (2006.01)

(52) U.S. Cl. .................... 310/346; 310/320; 310/365

(58) Field of Classification Search ................ 310/320, 310/346, 365; 333/187, 188
See application file for complete search history.

(56) References Cited

U.S. PATENT DOCUMENTS

| | | | |
|---|---|---|---|
| 7,199,504 B2 | 4/2007 | Komuro et al. | |
| 7,280,007 B2 | 10/2007 | Feng et al. | |
| 7,490,390 B2* | 2/2009 | Kawakubo et al. | 29/25.35 |
| 7,701,312 B2* | 4/2010 | Park et al. | 333/187 |
| 2003/0227338 A1* | 12/2003 | Kawakubo et al. | 331/107 A |
| 2005/0146401 A1* | 7/2005 | Tilmans et al. | 333/187 |
| 2005/0162040 A1* | 7/2005 | Robert | 310/322 |
| 2007/0284971 A1* | 12/2007 | Sano et al. | 310/364 |
| 2008/0074005 A1* | 3/2008 | Sano et al. | 310/363 |
| 2008/0143217 A1 | 6/2008 | Ho et al. | |
| 2008/0186109 A1 | 8/2008 | Ho et al. | |
| 2008/0246559 A1 | 10/2008 | Ayazi et al. | |

OTHER PUBLICATIONS

"Film Bulk Acoustic-Wave Resonator (FBAR)," Admitted Prior Art, http://mems.usc.edu/fbar.htm, Printed from the Internet Oct. 14, 2008, 3 pages.
"Finite element method," Admitted Prior Art, http://en.wikipedia.org/wiki/Finite_element_method, Printed from the Internet Oct. 28, 2008, 7 pages.

* cited by examiner

*Primary Examiner*—Thomas M Dougherty
(74) *Attorney, Agent, or Firm*—Myers Bigel, et al

(57) ABSTRACT

Micro-electromechanical devices include a temperature-compensation capacitor and a thin-film bulk acoustic resonator having a first terminal electrically coupled to an electrode of the temperature-compensation capacitor. The temperature-compensation capacitor includes a bimorph beam having a first electrode thereon and a second electrode extending opposite the first electrode. This bimorph beam is configured to yield an increase in spacing between the first and second electrodes in response to an increase in temperature of the micro-electromechanical device. This increase in spacing between the first and second electrodes leads to a decrease in capacitance of the temperature-compensation capacitor. Advantageously, this decrease in capacitance can be used to counteract a negative temperature coefficient of frequency associated with the thin-film bulk acoustic resonator, and thereby render the resonant frequency of the micro-electromechanical device more stable in response to temperature fluctuations.

19 Claims, 10 Drawing Sheets

MICRO-ELECTROMECHANICAL DEVICES HAVING VARIABLE CAPACITORS THEREIN THAT COMPENSATE FOR TEMPERATURE-INDUCED FREQUENCY DRIFT IN ACOUSTIC RESONATORS

CROSS-REFERENCE TO RELATED APPLICATION

This application is a continuation-in-part of U.S. application Ser. No. 12/393,566, filed Feb. 26, 2009, which is a continuation-in-part of U.S. application Ser. No. 12/363,142, filed Jan. 30, 2009, the disclosures of which are hereby incorporated herein by reference.

FIELD OF THE INVENTION

The present invention relates to integrated circuit devices and, more particularly, to micro-electromechanical devices and methods of forming same.

BACKGROUND OF THE INVENTION

Micro-electromechanical (MEMs) resonators that are operated in a lateral bulk extension mode may have several critical parameters that can influence resonator operating frequency. Some of these critical parameters can be highlighted by modeling performance of a resonator using a simplified bulk acoustic wave equation: $f=v/(2L)$, where f is a resonant frequency, v is an acoustic velocity of the resonator material and L is the lateral dimension of a resonator body along an axis of vibration. For a bulk acoustic resonator containing a resonator body with a composite stack of layers thereon, the acoustic velocity is a function of the Young's modulus, density and thickness of the resonator body and each of the stack of layers.

Accordingly, because the thicknesses of all of the layers may vary during deposition processes, variations in resonant frequency may be present between otherwise equivalent devices formed across a wafer(s). For example, variations in thicknesses of 1-2% across a wafer may cause significant deviations in frequency on the order of several thousands of parts-per-million (ppm).

The same is true for process-induced variations in the lateral dimensions of the resonator body, which may be caused by photolithographic and etching variations across a substrate (e.g., wafer) and batch processing of multiple substrates. These variations in lateral dimension can come from variations in the photolithographic patterning of the resonator body and from variations in sidewall angle during etching processes that separate the resonator body from a surrounding substrate. Unfortunately, these dimensional variations may cause a frequency drift on the order of several thousand ppm for a resonator operating in the megahertz resonant frequency range.

Similarly, a thin-film bulk acoustic resonator may be subject to temperature-induced frequency drift in resonant frequency, which is caused by materials (e.g., Si, AlN, Mo) within the resonator that have a negative temperature coefficient of frequency (TCF), resulting from a reduction in respective elastic constants as temperature increases. For example, an acoustic resonator having an even relatively small TCF value per degree of temperature variation, may have an unacceptably large resonant frequency variation across a range of normal operating temperatures.

SUMMARY OF THE INVENTION

Micro-electromechanical devices according to embodiments of the present invention include a temperature-compensation capacitor and a thin-film bulk acoustic resonator having a first terminal electrically coupled to an electrode of the temperature-compensation capacitor. The temperature-compensation capacitor includes a bimorph beam having a first electrode thereon and a second electrode extending opposite the first electrode. This bimorph beam is configured to provide an increase in spacing between the first and second electrodes in response to an increase in temperature of the micro-electromechanical device. This increase in spacing between the first and second electrodes leads to a decrease in capacitance of the temperature-compensation capacitor. Advantageously, this decrease in capacitance can be used to counteract a negative temperature coefficient of frequency associated with the thin-film bulk acoustic resonator, and thereby render the resonant frequency of the micro-electromechanical device more stable in response to temperature fluctuations.

According to some of these embodiments of the present invention, the thin-film bulk acoustic resonator and the bimorph beam may both contain respective first and second piezoelectric layers, which can be coplanar relative to each other. The thin-film bulk acoustic resonator may also include a semiconductor body and the first terminal of the thin-film bulk acoustic resonator may be a first electrode that extends on the semiconductor. This first electrode may be formed to be coplanar with the first electrode of the temperature-compensation capacitor.

A micro-electromechanical device according to still further embodiments of the present invention includes a thin-film bulk acoustic resonator having a negative temperature coefficient of frequency and a temperature-compensation capacitor electrically coupled in series with a terminal of the thin-film bulk acoustic resonator. This temperature-compensation capacitor includes a bimorph beam having a piezoelectric layer therein. The thin-film bulk acoustic resonator may include an input electrode, which is electrically coupled to an electrode of the temperature-compensation capacitor.

Additional embodiments of the present invention include methods of forming micro-electromechanical devices. Some of these methods include forming a semiconductor layer on a substrate and forming a sacrificial layer on the substrate, adjacent the semiconductor layer. An input electrode is also formed on the semiconductor layer and a first capacitor electrode is formed on the sacrificial layer. A piezoelectric layer is formed on the input electrode and on the first capacitor electrode. The sacrificial layer is removed to suspend a bimorph beam over an air gap. This bimorph beam includes a portion of the piezoelectric layer and the first capacitor electrode. The semiconductor layer is also patterned to define a resonator body that is suspended over the underlying substrate. The patterning of the semiconductor layer may follow the removal of the sacrificial layer.

According to further aspects of these embodiments of the present invention, the steps of forming an input electrode and forming a first capacitor electrode may include depositing a metal layer on the resonator body and on the sacrificial layer. This deposited metal layer can be patterned to define an input electrode that is electrically connected to the first capacitor electrode.

Methods of forming micro-electromechanical resonators according to additional embodiments of the invention include forming a semiconductor layer on a substrate and forming a sacrificial layer on the substrate. A stacked composite of an input electrode and a piezoelectric layer are formed on the semiconductor layer. A first capacitor electrode, which is electrically coupled to the input electrode, is also formed on the sacrificial layer. This sacrificial layer is removed to thereby suspend the first capacitor electrode over the substrate. The semiconductor layer and piezoelectric layer are also patterned to define a resonator body.

According to further aspects of these embodiments of the present invention, the step of removing the sacrificial layer is preceded by a step of forming an electrically insulating layer on the first capacitor electrode. Accordingly, the step of removing the sacrificial layer may include removing the sacrificial layer to thereby suspend a bimorph beam, which contains the first capacitor electrode and a portion of the electrically insulating layer. Moreover, in the event the step of forming a sacrificial layer is preceded by a step of forming a second capacitor electrode on the substrate, then the step of removing the sacrificial layer may include removing the sacrificial layer to thereby suspend the first capacitor electrode over the second capacitor electrode and define an air-gap therebetween. The electrically insulating layer may also be formed of a piezoelectric or non-piezoelectric material.

DESCRIPTION OF PREFERRED EMBODIMENTS

Figure 1:
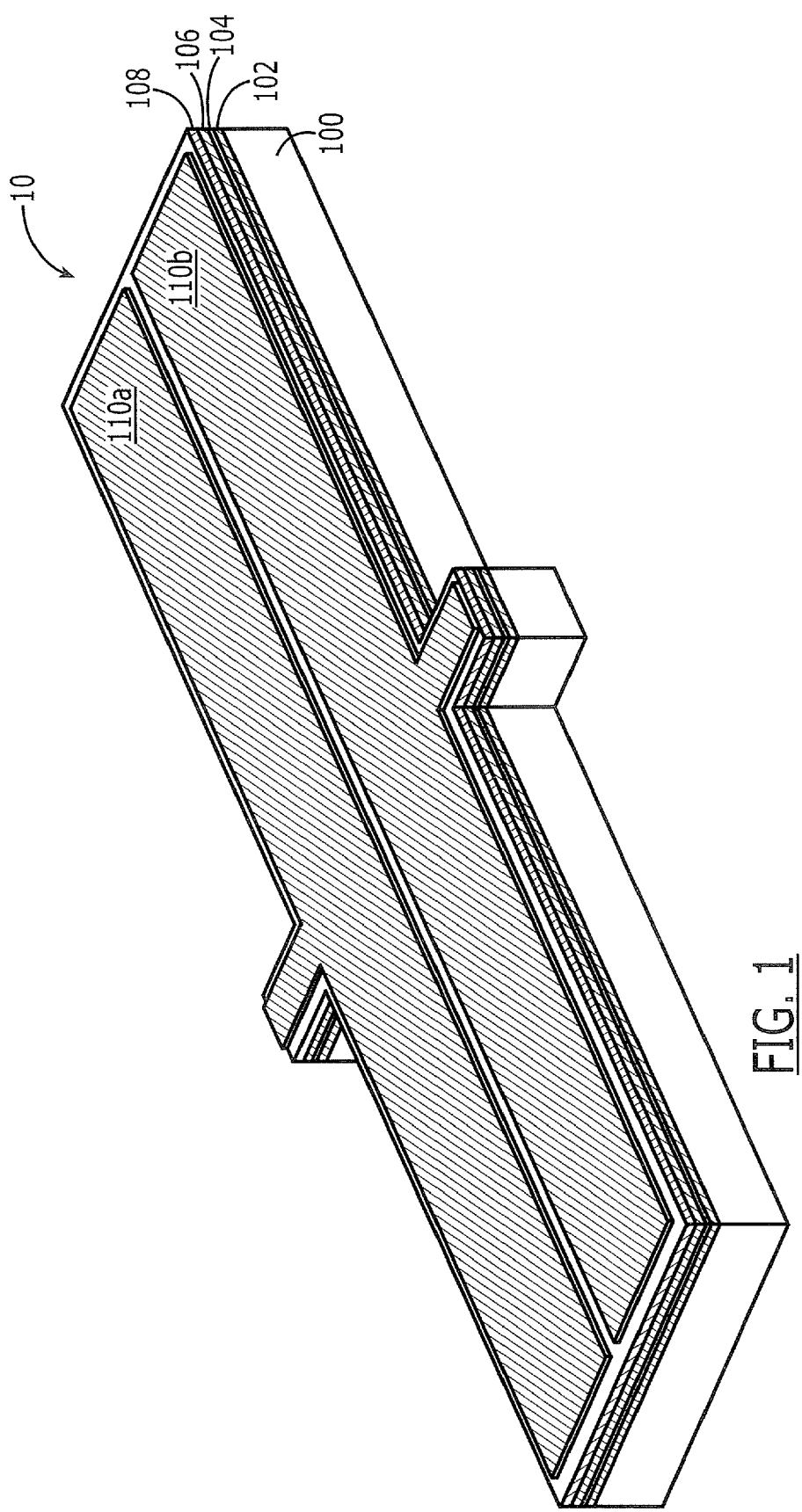
FIG. 1 is a perspective view of a portion of a thin-film bulk acoustic resonator according to an embodiment of the present invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof, it can be directly on, connected or coupled to the other element or layer or intervening elements or layers may be present. In contrast, when an element is referred to as being "directly on," "directly connected to" or "directly coupled to" another element or layer (and variants thereof, there are no intervening elements or layers present. Like reference numerals refer to like elements throughout. As used herein, the term "and/or" includes any and all combinations of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Embodiments of the present invention are described herein with reference to cross-section and perspective illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a sharp angle may be somewhat rounded due to manufacturing techniques/tolerances.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a perspective view of a portion of a thin-film bulk acoustic resonator 10 according to an embodiment of the present invention. The illustrated portion of the resonator 10 includes a composite of layers that may be collectively anchored on opposite sides to a surrounding substrate (not shown). This surrounding substrate may include a recess therein that extends underneath the illustrated portion of the resonator 10. Thus, the illustrated portion of the resonator 10 may be anchored to the surrounding substrate in a manner similar to the anchoring techniques illustrated and described in U.S. application Ser. No. 12/233,395, filed Sep. 18, 2008, entitled "Single-Resonator Dual-Frequency Lateral-Extension Mode Piezoelectric Oscillators, and Operating Methods Thereof," and US 2008/0246559 to Ayazi et al., entitled "Lithographically-Defined Multi-Standard Multi-Frequency High-Q Tunable Micromechanical Resonators," the disclosures of which are hereby incorporated herein by reference.

The composite of layers within the resonator 10 include a resonator body 100, a compensation layer 102, which may be optional, an adhesion layer 104, which may be optional, a bottom electrode 106, a piezoelectric layer 108 and an at least one top electrode (110a, 110b). As will be understood by those skilled in the art, the resonator body 100 may be formed as a semiconductor body, such as a single crystal silicon (Si) body, a quartz body or a body of other suitable material having low acoustic loss. The compensation layer 102 may be formed as an electrically insulating dielectric layer, such as a silicon dioxide layer, a silicon nitride layer, an aluminum oxide layer or another electrically insulating layer having a sufficiently positive temperature coefficient of elasticity.

The compensation layer 102 is illustrated as being formed directly on an upper surface of the resonator body 100, however, the compensation layer 102 may also be formed on an opposing bottom surface of the resonator body 100, according to alternative embodiments of the invention. The compensation layer 102 may operate to provide thermal compensation to the resonator 10.

The adhesion layer 104 is illustrated as being formed directly on an upper surface of the compensation layer 102. This adhesion layer 104, which may be formed of the same material as the piezoelectric layer 108, is provided between the compensation layer 102 (and/or resonator body 100) and the bottom electrode 106, which may be electrically biased at a fixed bias potential (e.g., reference voltage). This bottom electrode 106 may be formed as a metal layer, such as a molybdenum (Mo) or aluminum (Al) layer, for example. Other metals (e.g., Au, Ni) may also be used for the bottom electrode 106.

The resonator 10 further includes a piezoelectric layer 108 on the bottom electrode 106. This piezoelectric layer 108 may be formed of a piezoelectric material, such as aluminum nitride (AlN), zinc oxide (ZnO) or PZT, for example. The at least one top electrode is illustrated as including a first top electrode 110a, which may operate as an input electrode of the resonator 110, and a second top electrode 110b, which may operate as an output electrode of the resonator 10. The at least one top electrode and bottom electrode are preferably formed of the same materials.

As will now be described, by fixing the thicknesses of the resonator body 100, a relationship can be established between the combined thicknesses of the piezoelectric layer 108 and the adhesion layer 104, if any, and the combined thicknesses of the bottom electrode 106 and top electrodes 110a, 110b. This relationship may be used to reduce a susceptibility of the resonator 10 to process-induced variations in resonant frequency when the material thickness of the resonator body 100 deviates from its target thickness for a given resonator design. This reduction in susceptibility of the resonator 10 to process-induced variations in resonant frequency may be understood by modeling the resonant frequency of the resonator 10 as a function of the thickness ($t_i$), Young's modulus ($E_i$) and density ($\rho_i$) of the layers illustrated by FIG. 1, for the case where no compensation layer is present. This modeling can be illustrated by the following bulk acoustic wave equation, which applies to a three-material resonator containing a resonator body (1), a piezoelectric layer (2) and an electrode layer (3):

$$f = \frac{n}{2L}\sqrt{\frac{E_1 t_1 + E_2 t_2 + E_3 t_3}{\rho_1 t_1 + \rho_2 t_2 + \rho_3 t_3}} \quad (1)$$

where "n" is the order of mode and L is the frequency defining dimension. This equation can be reduced to a bulk acoustic wave equation for a simplified body-only (e.g., Si only) resonator, which is typically characterized as a resonator having a very low susceptibility to process-induced variations in resonant frequency when body thickness variations occur during fabrication. In particular, the reduction in the acoustic wave equation for a three-material resonator can be achieved by satisfying the following relationship between the combined thicknesses of the piezoelectric layer 108 and the adhesion layer 104, if any, and the combined thicknesses of the bottom electrode 106 and the top electrodes 110a, 110b:

$$1 = \sqrt{\frac{t_1 + \frac{E_2}{E_1} t_2 + \frac{E_3}{E_1} t_3}{t_1 + \frac{\rho_2}{\rho_1} t_2 + \frac{\rho_3}{\rho_1} t_3}} \quad (2)$$

This relationship can be further simplified to eliminate the thickness of the resonator body therefrom and establish a preferred ratio in thicknesses between the combined electrode layers ($t_3$) and the piezoelectric layer ($t_2$) (or piezoelectric layer and adhesion layer):

$$\frac{t_3}{t_2} = \frac{E_2 \rho_1 - E_1 \rho_2}{E_1 \rho_3 - E_3 \rho_1} \quad (3)$$

This simplified equation can be further reduced to a ratio of $t_3/t_2$ of about 0.12 based on the material characteristics of Si, AlN and Mo illustrated by TABLE 1, or about 0.46 based on the material characteristics of Si, AlN and Al.

TABLE 1

| MATERIAL | YOUNG'S MODULUS (GPa) | DENSITY (Kg/m$^3$) |
|---|---|---|
| Si (1) | 169 | 2330 |
| AlN (2) | 295 | 3260 |
| Mo (3) | 220 | 9700 |
| Al (3') | 70 | 2700 |
| SiO$_2$ (4) | 73 | 2200 |

According to still further embodiments of the present invention, the above-described modeling can be extended to a four-material resonator containing a resonator body (1), a piezoelectric layer (2), an electrode layer (3) and a compensation layer (4). In particular, a reduction in the acoustic wave equation for a four-material resonator can be achieved by satisfying the following relationship between the combined thicknesses of the piezoelectric layer 108 and adhesion layer 104, if any, the combined thicknesses of the bottom electrode 106 and top electrodes 110a, 110b and the thickness of the compensation layer:

$$1 = \sqrt{\frac{t_1 + \frac{E_2}{E_1} t_2 + \frac{E_3}{E_1} t_3 + \frac{E_4}{E_1} t_4}{t_1 + \frac{\rho_2}{\rho_1} t_2 + \frac{\rho_3}{\rho_1} t_3 + \frac{\rho_4}{\rho_1} t_4}} \quad (4)$$

This equation can be further simplified to eliminate the thickness of the resonator body therefrom:

$$\frac{E_2}{E_1} t_2 + \frac{E_3}{E_1} t_3 + \frac{E_4}{E_1} t_4 = \frac{\rho_2}{\rho_1} t_2 + \frac{\rho_3}{\rho_1} t_3 + \frac{\rho_4}{\rho_1} t_4 \quad (5)$$

Moreover, by establishing a material and thickness of the compensation layer (4), the values of $E_4$, $\rho_4$ and $t_4$ become known, the desired value of $t_3$ can be computed once the target value of $t_2$ has been established (or vice versa).

Although not wishing to be bound by any theory, finite element simulation methods can be used to demonstrate the accuracy of the above analytical approach to reducing process-induced variations in resonant frequency for those cases where the resonator's frequency defining dimension (i.e., body length) is substantially larger than the width of the resonator body. However, for those cases where the resonator's frequency defining dimension is much smaller than the width of the resonator body, the analytical predictions can be off by a factor of about two when compared to the finite element simulation results. Accordingly, by combining the analytical predictions with finite element results, process-induced variations in resonant frequency can be reduced in a three-material resonator when the combined thickness "$t_3$" of the top and bottom electrodes is formed to be within the following range:

$$t_2 \left[ \frac{E_2 \rho_1 - E_1 \rho_2}{E_1 \rho_3 - E_3 \rho_1} \right] \leq t_3 \leq 2 t_2 \left[ \frac{E_2 \rho_1 - E_1 \rho_2}{E_1 \rho_3 - E_3 \rho_1} \right] \quad (6)$$

where "$t_2$" is the thickness of the piezoelectric layer; $E_1$, $E_2$ and $E_3$ are the Young's modulus of the resonator body, the piezoelectric layer and the bottom and top electrodes, respectively; and $\rho_1$, $\rho_2$ and $\rho_3$ are the densities of the resonator body, the piezoelectric layer and the bottom and top electrodes, respectively.

Similarly, by combining the analytical predictions with finite element results, process-induced variations in resonant frequency can be reduced in a four-material resonator when the combined thickness "$t_3$" of the top and bottom electrodes is formed to be within the following range:

$$\left[ \frac{\frac{\rho_2}{\rho_1} t_2 + \frac{\rho_4}{\rho_1} t_4 - \frac{E_2}{E_1} t_2 - \frac{E_4}{E_1} t_4}{\frac{E_3}{E_1} - \frac{\rho_3}{\rho_1}} \right] \leq t_3 \leq 2 \left[ \frac{\frac{\rho_2}{\rho_1} t_2 + \frac{\rho_4}{\rho_1} t_4 - \frac{E_2}{E_1} t_2 - \frac{E_4}{E_1} t_4}{\frac{E_3}{E_1} - \frac{\rho_3}{\rho_1}} \right] \quad (7)$$

where $t_2$ and $t_4$ are the thicknesses of the piezoelectric layer and the compensation layer, respectively; $E_1$, $E_2$, $E_3$ and $E_4$ are the Young's modulus of the resonator body, the piezoelectric layer, the bottom and top electrodes and the compensation layer, respectively; and $\rho_1$, $\rho_2$, $\rho_3$ and $\rho_4$ are the densities of the resonator body, the piezoelectric layer, the bottom and top electrodes and the compensation layer, respectively. Finite element simulation results further demonstrate that a preferred scaling factor of about 1.6 can be added to the left sides of equations (6) and (7) for those cases where the resonator's frequency defining dimension (i.e., body length) is not substantially larger than the width of the resonator body.

Figure 2A:
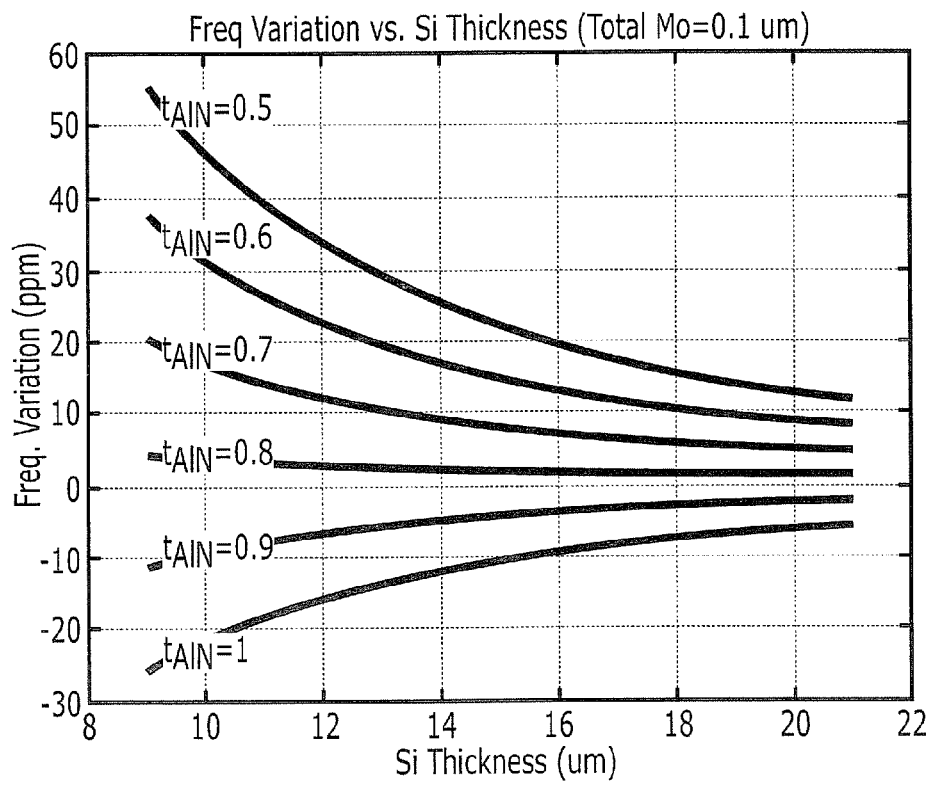
FIG. 2A is a graph illustrating frequency variation (ppm) versus silicon resonator body thickness, for thin-film bulk acoustic resonators having aluminum nitride (AlN) piezoelectric layers of varying thickness ranging from 0.5 to 1.0 microns and molybdenum (Mo) electrodes with a combined thickness of 0.1 microns.
Figure 2B:
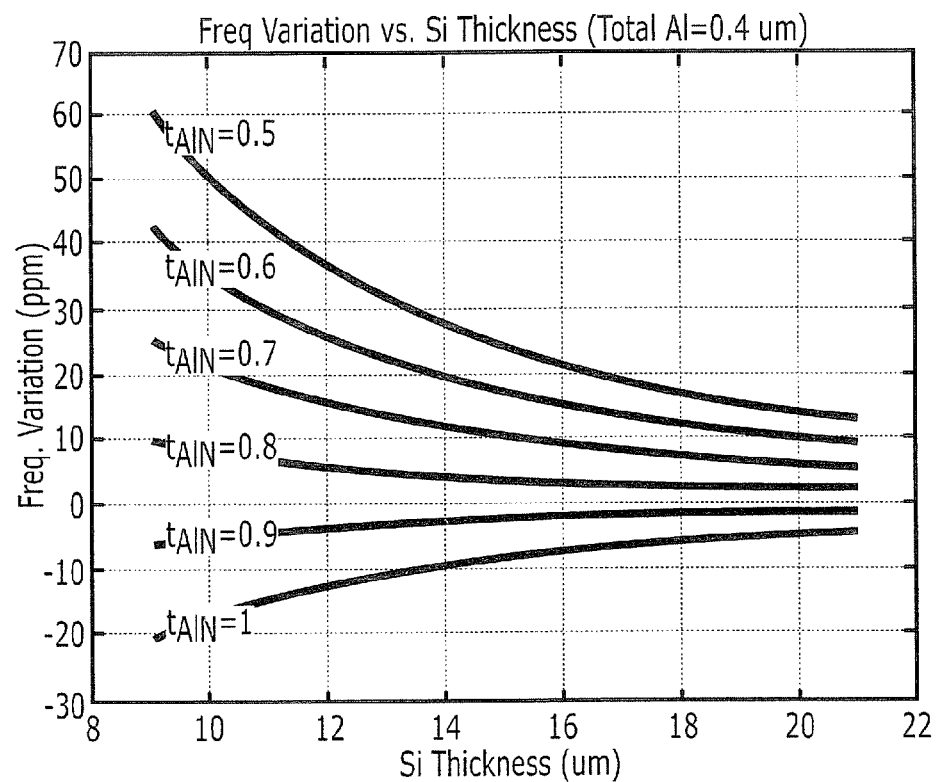
FIG. 2B is a graph illustrating frequency variation (ppm) versus silicon resonator body thickness, for thin-film bulk acoustic resonators having aluminum nitride (AlN) piezoelectric layers of varying thickness ranging from 0.5 to 1.0 microns and aluminum (Al) electrodes with a combined thickness of 0.4 microns.

The reduction in process-induced resonant frequency variations that can be achieved by maintaining the combined thickness of the electrodes within the designated ranges can be illustrated by FIGS. 2A-2C and 3A-3B. In particular, FIG. 2A is a graph illustrating frequency variation (ppm) versus silicon resonator body thickness, for thin-film bulk acoustic resonators having aluminum nitride (AlN) piezoelectric layers of varying thickness ranging from 0.5 to 1.0 microns and molybdenum (Mo) electrodes with a combined thickness of 0.1 microns. As illustrated, a $t_3/t_2$ ratio of 0.12 (Mo=0.1/AlN=0.83) yields a low level of process-induced resonant frequency variation for silicon resonator bodies having a target thickness of 20 microns. Alternatively, FIG. 2B illustrates frequency variation (ppm) versus silicon resonator body thickness, for thin-film bulk acoustic resonators having aluminum nitride (AlN) piezoelectric layers of varying thickness ranging from 0.5 to 1.0 microns and aluminum (Al) electrodes with a combined thickness of 0.4 microns. As illustrated by FIG. 2B, a $t_3/t_2$ ratio of 0.465 (Al=0.4/AlN=0.86) yields a low level of process-induced resonant frequency variation for silicon resonator bodies having a target thickness of 20 microns.

Figure 2C:
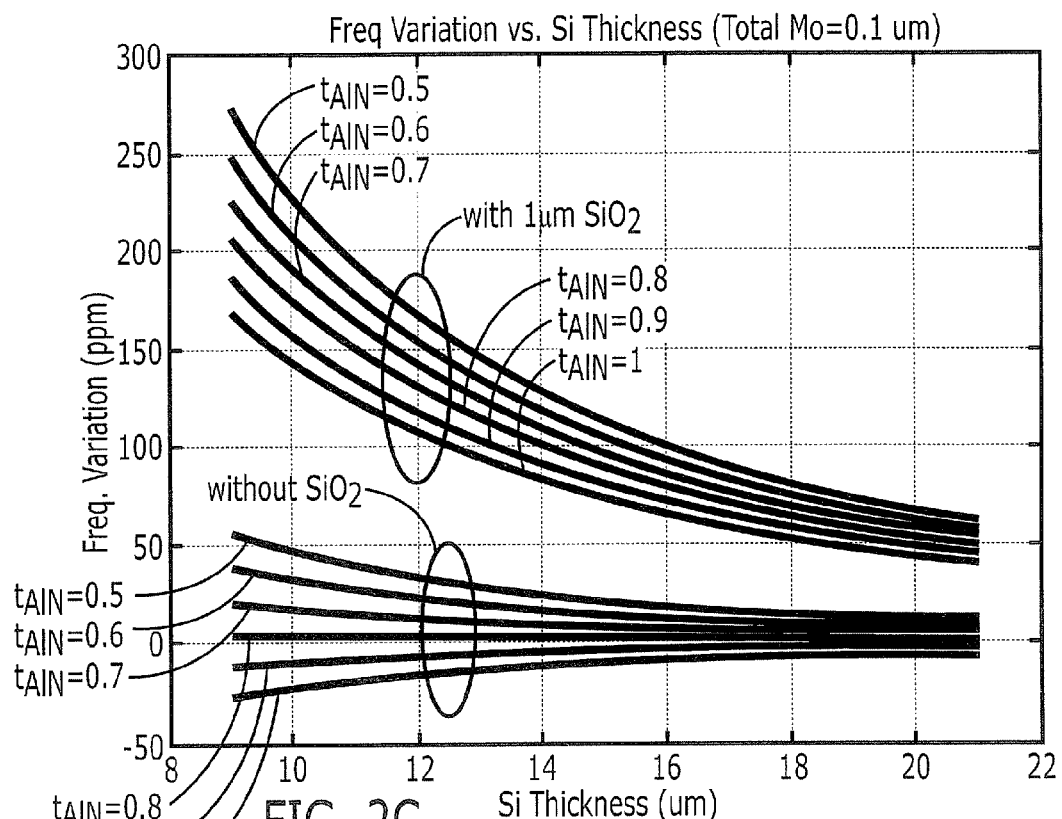
FIG. 2C is a graph illustrating frequency variation (ppm) versus silicon resonator body thickness, for: (i) thin-film bulk acoustic resonators having aluminum nitride (AlN) piezoelectric layers of varying thickness ranging from 0.5 to 1.0 microns and molybdenum (Mo) electrodes with a combined thickness of 0.1 microns; and (ii) thin-film bulk acoustic resonators having aluminum nitride (AlN) piezoelectric layers of varying thickness ranging from 0.5 to 1.0 microns, molybdenum (Mo) electrodes with a combined thickness of 0.1 microns and a 1.0 micron thick silicon dioxide compensation layer.

FIG. 2C is a graph illustrating frequency variation (ppm) versus silicon resonator body thickness, for: (i) thin-film bulk acoustic resonators having aluminum nitride (AlN) piezoelectric layers of varying thickness ranging from 0.5 to 1.0 microns and molybdenum (Mo) electrodes with a combined thickness of 0.1 microns; and (ii) thin-film bulk acoustic resonators having aluminum nitride (AlN) piezoelectric layers of varying thickness ranging from 0.5 to 1.0 microns, molybdenum (Mo) electrodes with a combined thickness of 0.1 microns and a 1.0 micron thick silicon dioxide compensation layer. As illustrated, the inclusion of a silicon dioxide compensation layer on a silicon resonator body increases the degree of process-induced resonant frequency variation relative to an otherwise equivalent device.

Figure 3A:
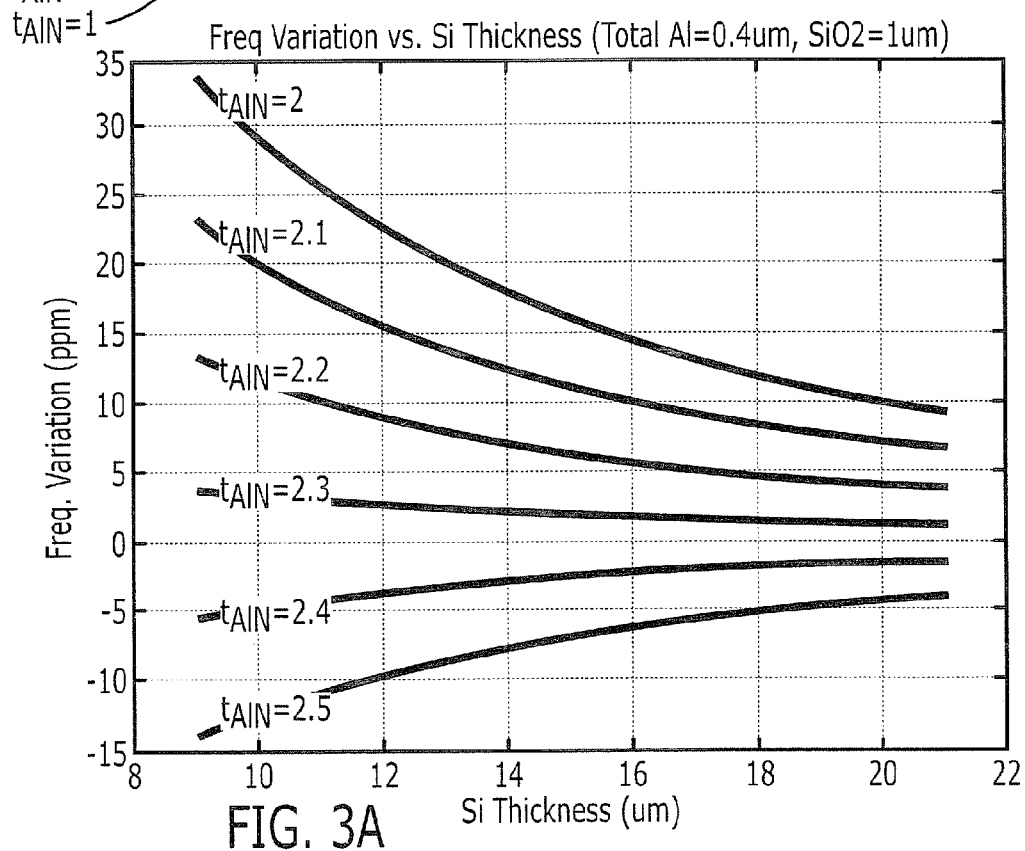
FIG. 3A is a graph illustrating frequency variation (ppm) versus silicon resonator body thickness for thin-film bulk acoustic resonators having aluminum nitride (AlN) piezoelectric layers of varying thickness ranging from 2.0 to 2.5 microns, aluminum (Al) electrodes with a combined thickness of 0.4 microns and a 1.0 micron thick silicon dioxide compensation layer.

FIG. 3A is a graph illustrating frequency variation (ppm) versus silicon resonator body thickness, for thin-film bulk acoustic resonators having aluminum nitride (AlN) piezoelectric layers of varying thickness ranging from 2 to 2.5 microns, aluminum (Al) electrodes with a combined thickness of 0.4 microns and a 1.0 micron thick silicon dioxide compensation layer. As illustrated, a $t_3/t_2$ of about 0.17 (i.e., 0.4/2.3) yields a relatively low level of process-induced resonant frequency variation with the silicon resonator body has a thickness of about 20 microns. This value of 0.17 is consistent with a value predicted by a left side of equation (7) for the case where the resonator's frequency defining dimension (i.e., body length) is substantially larger than the width of the resonator body.

Figure 3B:
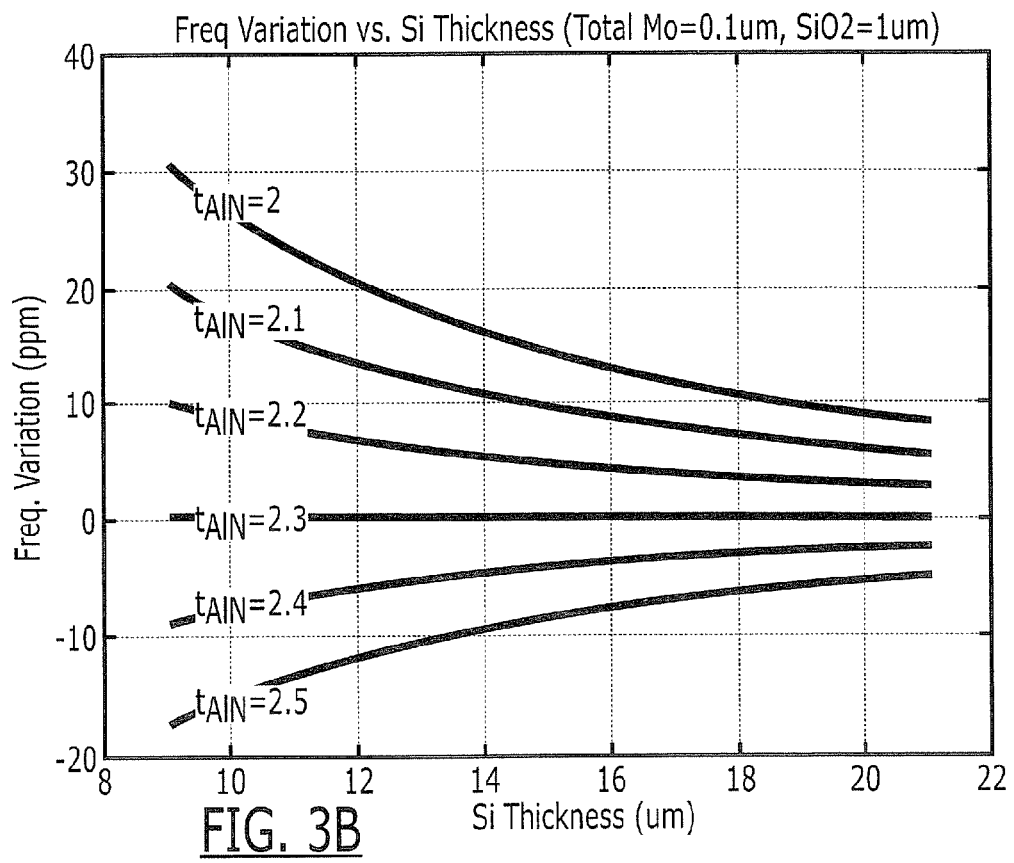
FIG. 3B is a graph illustrating frequency variation (ppm) versus silicon resonator body thickness, for thin-film bulk acoustic resonators having aluminum nitride (AlN) piezoelectric layers of varying thickness ranging from 2.0 to 2.5 microns, molybdenum (Mo) electrodes with a combined thickness of 0.1 microns and a 1.0 micron thick silicon dioxide compensation layer.

Similarly, FIG. 3B is a graph illustrating frequency variation (ppm) versus silicon resonator body thickness, for thin-film bulk acoustic resonators having aluminum nitride (AlN) piezoelectric layers of varying thickness ranging from 2 to 2.5 microns, molybdenum (Mo) electrodes with a combined thickness of 0.1 microns and a 1.0 micron thick silicon dioxide compensation layer. As illustrated, a $t_3/t_2$ of about 0.043 (i.e., 0.1/2.3) yields a relatively low level of process-induced resonant frequency variation with the silicon resonator body has a thickness of about 20 microns. This value of 0.043 is consistent with a value predicted by a left side of equation (7) for the case where the resonator's frequency defining dimension (i.e., body length) is substantially larger than the width of the resonator body.

Figure 4A:
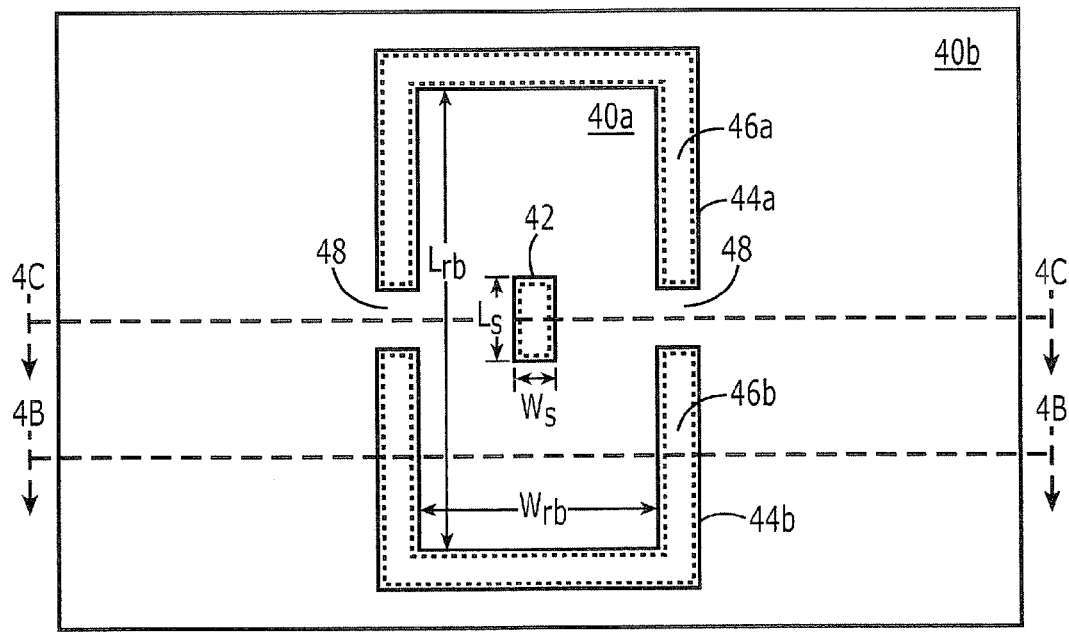
FIG. 4A is a plan view of a micro-electromechanical acoustic resonator, according to embodiments of the present invention.
Figure 4B:
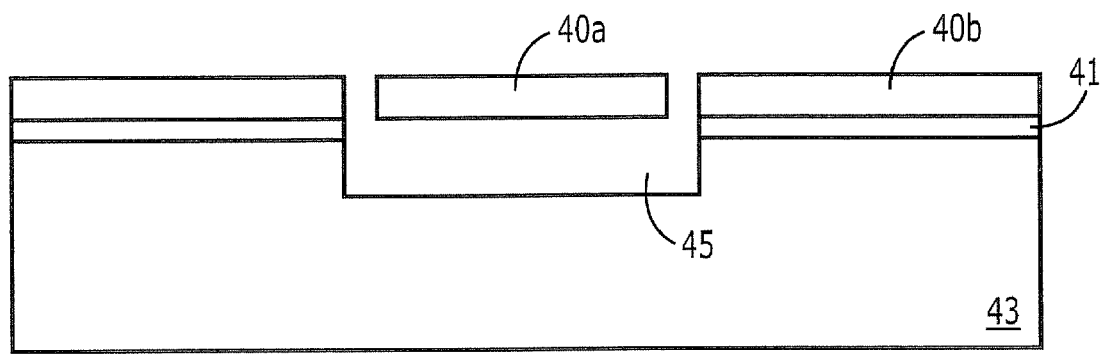
FIG. 4B is a cross-sectional view of the resonator of FIG. 4A, taken along line 4B-4B.
Figure 4C:
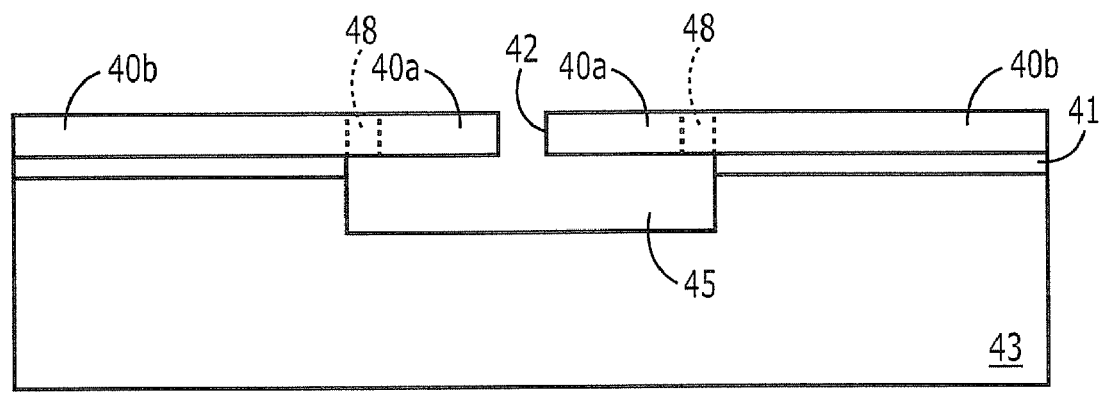
FIG. 4C is a cross-sectional view of the resonator of FIG. 4A, taken along line 4C-4C.

Referring now to FIGS. 4A-4C, a micro-electromechanical acoustic resonator according to additional embodiments of the present invention includes a resonator body 40a suspended over a recess 45 in a substrate, which is illustrated as including a supporting layer 43 and an electrically insulating layer 41 (e.g., silicon dioxide layer) on the supporting layer 43. The supporting layer 43 may be a semiconductor substrate (e.g., silicon substrate), however, other materials may also be used. The resonator body 40a is anchored on opposing sides (e.g., by tabs 48) to a surrounding region 40b, which may be formed of the same material as the resonator body 40a. For example, the resonator body 40a may be formed by photolithographically patterning a single crystal silicon layer to define trench patterns 44a, 44b therein, which extends entirely through the single crystal silicon layer. The trench patterns 44a, 44b separate a majority of the resonator body 40a from the surrounding region 40b by a pair of through-body trenches 46a, 46b, as illustrated. In some embodiments of the invention, the resonator body 40a and surrounding region 40b may have a thickness of about 20 microns, for example.

The resonator body 40a is illustrated as having a single rectangular-shaped perforation/slot 42 therein, which extends completely through the resonator body 40a. According to alternative embodiments of the present invention, the perforation/slot 42 may extend substantially (e.g., at least 50%) through the resonator body 40a. Although not wishing to be bound by any theory, it is believed that an extension of the perforation 42 completely through the resonator body 40a provides a much greater degree of compensation for process-induced variations in resonant frequency relative to an otherwise equivalently shaped and located perforation that does not extend completely through the resonator body 40a. The lateral dimensions of the resonator body 40a are illustrated as $L_{rb}$ (length) and $W_{rb}$ (width) and the lateral dimensions of the perforation 42 are illustrated as $L_s$ (length) and $W_s$ (width).

These dimensions of the resonator body 40a and perforation 42 are influenced by the photolithographic patterning and trench etching of the single crystal silicon layer. Accordingly, any variation in the actual widths of the trenches 46a, 46b can cause a two times variation in the lateral dimensions of the resonator body 40a. Moreover, as will be understood by those skilled in the art, any variations in the actual widths of the trenches 46a, 46b and perforation 42 (as shown by the dotted lines within these regions in FIG. 4A) can be caused by variations in photolithographic patterning as well as variations in the sidewall profiles of the resonator body 40a that occur during the etching process (e.g., dry etching process, such as DRIE).

Figure 4D:
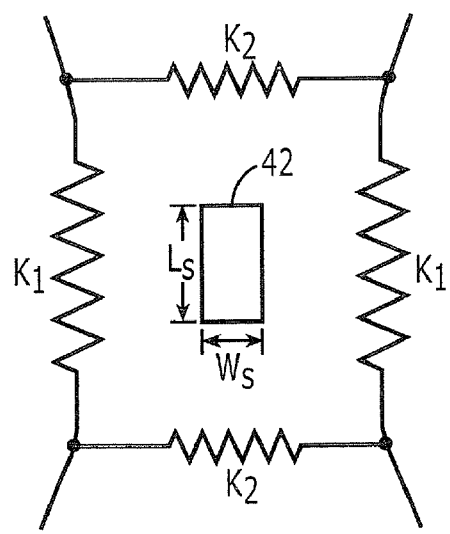
FIG. 4D is a simplified mechanical model of the resonator of FIG. 4A.

Referring now to FIG. 4D, the addition of the single perforation 42 at the center of the resonator body 40a, as illustrated by FIG. 4A, can be treated, for modeling purposes, as dividing the resonator body 40a into two parallel resonators (springs K1). These two resonators K1, which extend on opposing sides (e.g., left and right) of the body 40a and are separated by the perforation 42, are mechanically coupled by two coupling springs K2. Each of these coupling springs K2 extends across a respective end of the body 40a. The coupling springs K2 operate to counteract process-induced changes in the stiffness-to-mass ratio of the resonators K1 that may be caused by lateral dimension variations. For example, in an uncompensated resonator (i.e., without perforation 42), a process-induced increase in the lateral dimension of the resonator body 40a will typically cause a decrease in resonant frequency resulting from a decrease in the stiffness-to-mass ratio of each resonator K1. However, with the addition of the perforation 42, the characteristics of the coupling springs K2, which also change in response to lateral dimension variations, compensate for changes in the stiffness-to-mass ratios of the resonators K1. Based on this compensation, the resonator body 40a becomes less susceptible to process-induced variations in resonant frequency caused by process-induced lateral dimension variations.

Although not wishing to be bound by any theory, the susceptibility of the acoustic resonator to process-induced resonant frequency variations can be further reduced by proper placement of the perforation 42 within the resonator body 40a. In particular, the perforation 42 can be patterned so that during resonant frequency operation, a nodal line in the resonator body (i.e., the line that remains at rest while other portions of the body are in a state of vibration) passes across an interior of the perforation 42. In additional embodiments of the present invention, the perforation 42 can be patterned so that a projected point of maximum stress in the resonator body 40a is within an interior of the perforation 42. In some embodiments of the invention, this location of the projected point of maximum stress during resonant frequency operation can be met by dimensioning the resonator body 40a and perforation 42 so that a center-of-mass of the resonator body 40a is within an interior of the perforation 42. Thus, in some embodiments of the invention, the center-of-mass and projected point of maximum stress may overlap and in other embodiments of the present invention the center-of-mass of the resonator body may be located on the nodal line.

According to still further embodiments of the present invention, process-induced resonant frequency variations can be further reduced by setting one dimension of the perforation 42 to be equal to the widths of trench patterns 44a, 44b, so that the photolithography and etch biases for the perforation 42 and trench patterns 44a, 44b will be more uniform. In particular, the resonator body 40a can be configured so that a sidewall of the resonator body 40a can be separated from an opposing sidewall of the supporting substrate by a distance equivalent to a width of the single perforation 42. Moreover, to further reduce process-induced changes in resonant frequency caused by dimension variations, the length ($L_s$) and width ($W_s$) of the single perforation 42 may be related to a length ($L_{rb}$) and a width ($W_{rb}$) of the resonator body 40a by the following relationship:

$$(0.4)L_{rb}(W_s/2(L_{rb}-W_{rb}+W_s))^{1/2} \leq L_s \leq (0.6)L_{rb}(W_s/2(L_{rb}-W_{rb}+W_s))^{1/2}.$$

In meeting this relationship, the resonator body 40a may be configured so that the body length ($L_{rb}$) is greater than the body width ($W_{rb}$), and the perforation length ($L_s$) is greater than the perforation width ($W_s$). According to still further embodiments of the present invention, the above relationship may be further limited so that:

$$L_s = (s_f)L_{rb}(W_s/2(L_{rb}-W_{rb}+W_s))^{1/2},$$

where $s_f$ is a scaling factor equal to about 0.5 for the case where $L_s > W_s$.

Figure 5A:
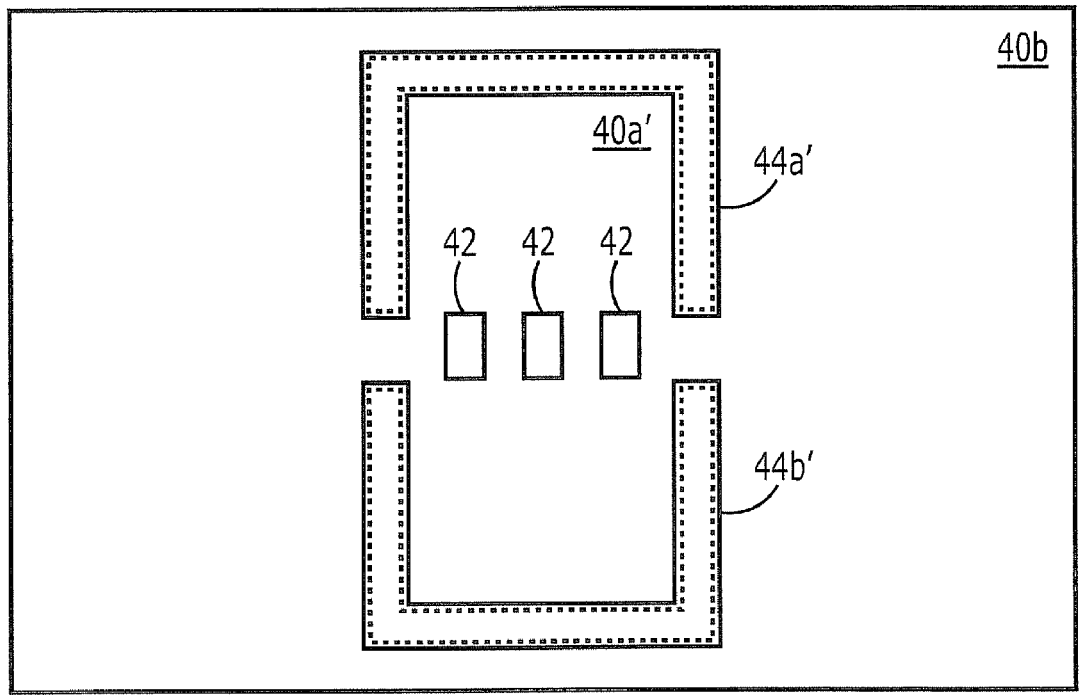
FIGS. 5A-5B are plan views of micro-electromechanical acoustic resonators, according to additional embodiments of the present invention.

The resonator embodiments of FIGS. 4A-4D may be modified by increasing the number of perforations within a resonator body. As illustrated by FIG. 5A, a resonator body 40a' may be provided with three perforations 42 therein, for the case where $L_{rb} > W_{rb}$. The perforations 42 may be arranged in a straight line between the opposing points of anchor, which attach the resonator body 40a' to the surrounding region 40b. In particular, the perforations 42 may be arranged along a nodal line of the resonator body 40a'. Alternative shapes and locations of the perforations may also be possible. The dimensions of the anchors are defined by the trench patterns 44a' and 44b'.

Figure 5B:
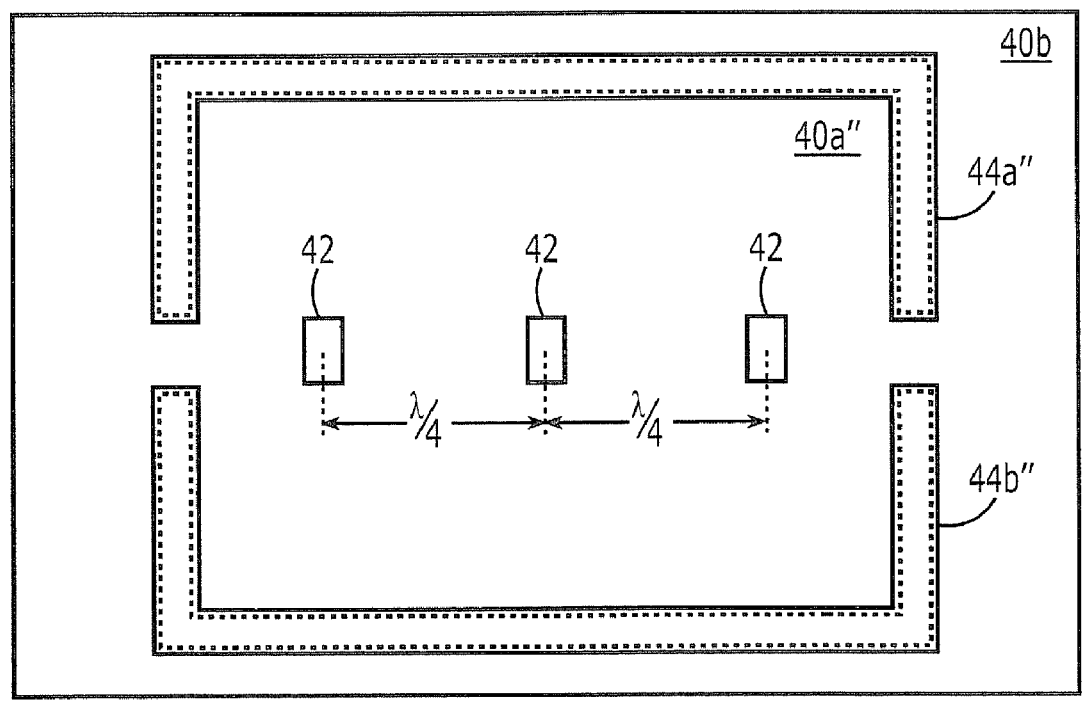

Similarly, as illustrated by FIG. 5B, a resonator body 40a" may be provided with three perforations 42 therein, for the case where $L_{rb} < W_{rb}$. The perforations 42, which can have the same or different dimensions in some cases, may be arranged in a straight line between the opposing points of anchor, which attach the resonator body 40a" to the surrounding region 40b. The dimensions of the anchors are defined by the trench patterns 44a" and 44b". Thus, as illustrated by FIG. 5B, a resonator body 40a" may have N>1 perforations therein and the N perforations 42 may have equivalent lengths ($L_s$) and equivalent widths ($W_s$). Moreover, the widths of the perforations 42 may be equal to the widths of the trench patterns 44a" and 44b". The dimensions of the perforations 42 can also be related to a length ($L_{rb}$) and a width ($W_{rb}$) of the resonator body 40a" by the following relationship:

$$(0.4)L_{rb}(W_s/2(L_{rb}-(W_{rb}/N)+W_s))^{1/2} \leq L_s \leq (0.6)L_{rb}(W_s/2(L_{rb}-(W_{rb}/N)+W_s))^{1/2},$$

for the case where the body length ($L_{rb}$) is less than the body width ($W_{rb}$). The resonator body 40a" may also be configured to have a center-of-mass within an interior of the middle one of the plurality of perforations 42. The center-to-center pitch between the perforations 42 may also be designed to be equal to $\lambda/4$, where $\lambda$ is a wavelength associated with a resonant frequency of the resonator body 40a".

Figure 6A:
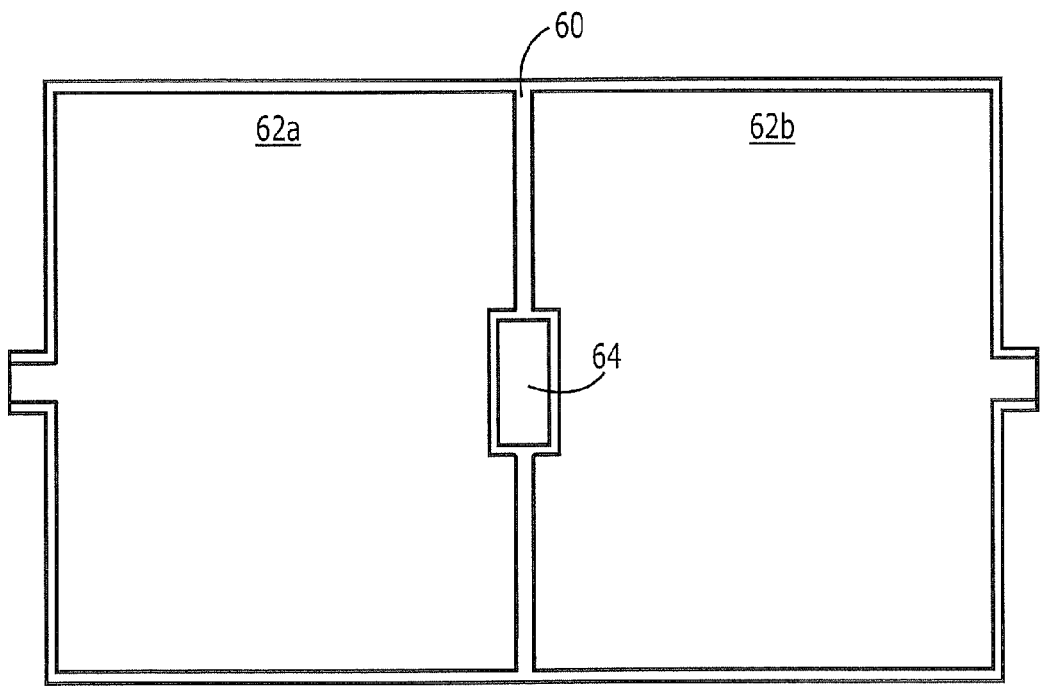
FIGS. 6A-6B are plan views of micro-electromechanical acoustic resonators, according to still further embodiments of the present invention.
Figure 6B:
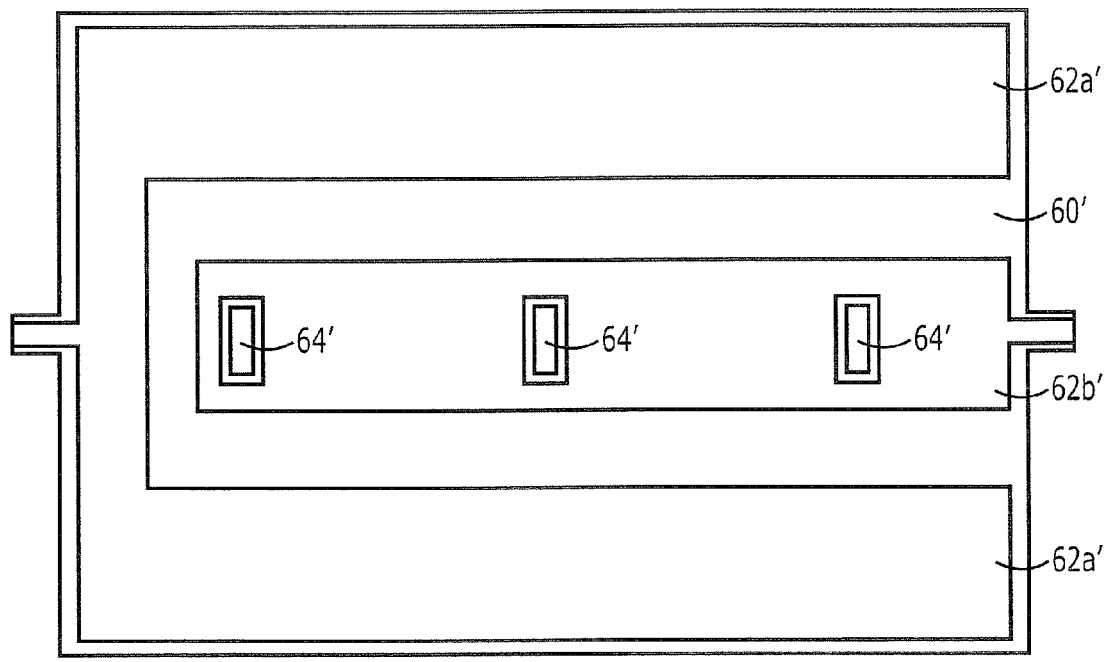
Figure 6C:
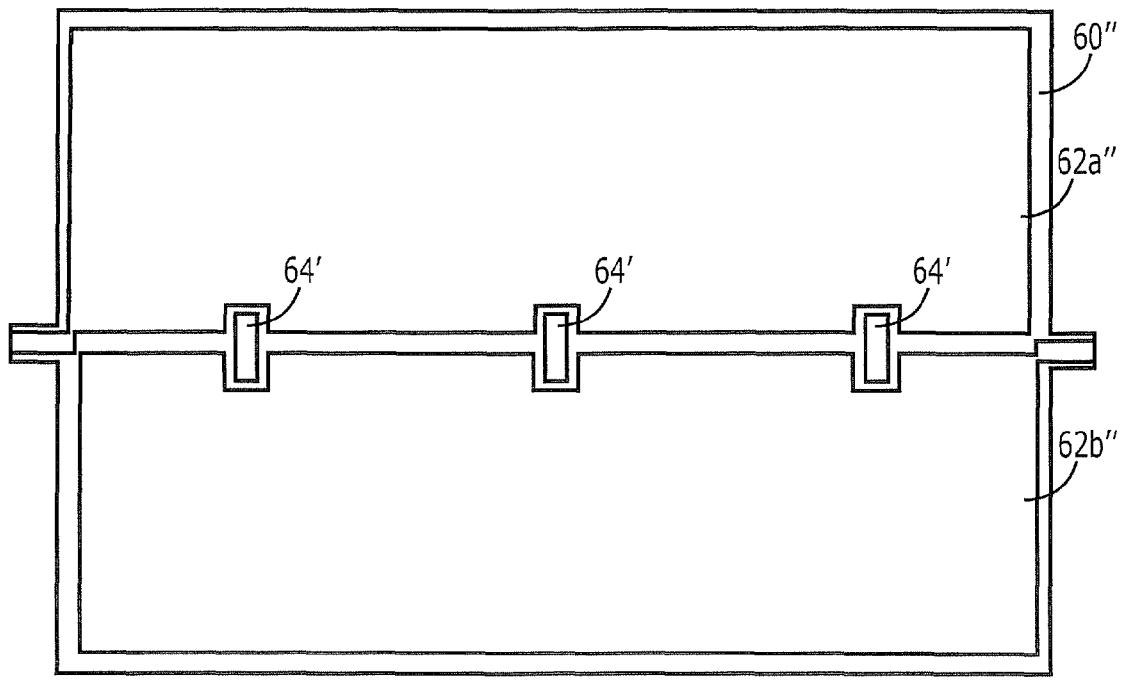

Referring now to FIG. 6A, a resonator body 60 according to an embodiment of the present invention includes a single perforation 64 that is located along a nodal line of the resonator body and also at a center-of-mass of the body 60. First and second electrodes 62a and 62b are also provided, which partially surround the central perforation 64. FIG. 6B illustrates a resonator body 60' with three perforations 64' therein that are spaced apart from each other at equivalent center-to-center pitches. The center-to-center pitch may correspond to $\lambda/4$, where $\lambda$ is a wavelength associated with a resonant frequency of the resonator body 60'. First and second electrodes 62a' and 62b' are provided on the left and right sides of the resonator body 60'. The first electrode 62a' surrounds the leftmost perforation 64' and the second electrode 62b' surrounds the rightmost perforation 64'.

Figure 7A:
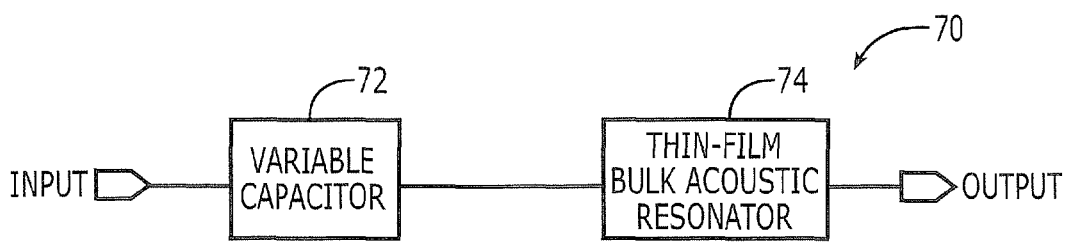
FIG. 7A is a block diagram of a micro-electromechanical device according to an embodiment of the present invention.

Referring now to FIG. 7A, a micro-electromechanical device 70 according to additional embodiments of the present invention includes a thin-film bulk acoustic resonator 74 and a variable capacitor 72, which is configured to compensate for temperature-induced frequency drift in the resonant frequency of the thin-film bulk acoustic resonator 74. This temperature-induced frequency drift is caused by materials (e.g., Si, AlN, Mo) within the resonator 74 that have a negative temperature coefficient of frequency (TCF), resulting from a reduction in respective elastic constants as temperature increases. Thus, in the absence of compensation, an acoustic resonator having a combined TCF value of about –30 ppm/° C. may have an unacceptably large resonant frequency variation of about 4000 ppm across a temperature variation from –40° C. to 85° C.

According to these embodiments of the present invention, the variable capacitor 72 may utilize an out-of-plane displacement of an electrode therein, which occurs in response to temperature fluctuation, to compensate for a temperature-dependent stiffness variation associated with the thin-film bulk acoustic resonator 74. This out-of-plane displacement may be provided by a bimorph structure containing a first electrode of the variable capacitor 72, which is suspended opposite a second electrode of the variable capacitor 72. As highlighted more fully hereinbelow with respect to FIGS. 8A-8D and 9A-9D, the bimorph structure may include at least two layers having different coefficients of thermal expansion (CTE). These two layers may include a dielectric layer having a relatively small CTE of about 0.5-3 ppm/° C., for example, and a metal layer having a substantially larger CTE, which is formed on the dielectric layer. According to some embodiments of the invention, the dielectric layer may include a material such as $SiO_2$, SiN and AlN, for example, and the metal layer may include a metal such as aluminum (Al) having a CTE of about 23 ppm/° C., or gold (Au) having a CTE of about 14 ppm/° C., or copper (Cu) having a CTE of about 16 ppm/° C. Alternatively, the at least two layers of the bimorph structure may include a metal layer having a relatively large CTE and another non-dielectric layer (e.g., polysilicon) having a relatively smaller CTE.

Advantageously, when the bimorph structure undergoes a temperature increase, the two layers will expand differently due to the CTE mismatch and a vertical displacement of the first capacitor electrode will occur relative to the second capacitor electrode. This vertical displacement will result in a decrease in a capacitance of the variable capacitor 72, which can compensate for the negative TCF associated with the materials within the thin-film bulk acoustic resonator 74.

Figure 7B:
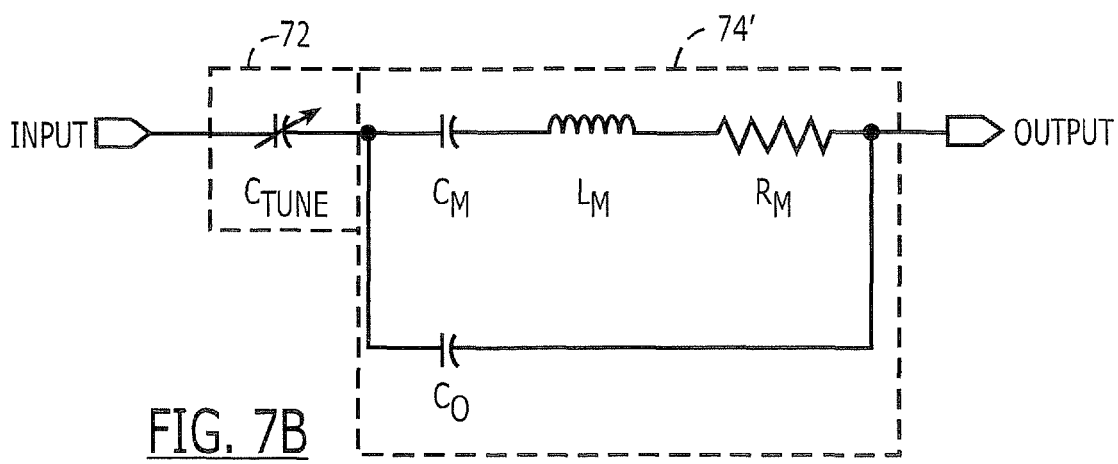
FIG. 7B is a simplified electrical schematic of the micro-electromechanical device of FIG. 7A.

This compensation provided by the variable capacitor 72 can be further understood by reference to the simplified electrical schematic of FIG. 7B. As illustrated by FIG. 7B, the compensation for the negative TCF of the resonator 74 of FIG. 7A can be provided by placing the bimorph capacitor 72 ($C_{tune}$) in series with the thin-film bulk acoustic resonator 74', which can be modeled by an RLC resonant circuit in parallel with a small feed-though capacitor ($C_o$). This series compensation yields a combined self-compensating circuit for the micro-electromechanical device 70, which has a resonant frequency (f) equal to:

$$f = \frac{1}{2\pi\sqrt{L_m C_m}}\sqrt{1 + \frac{C_m}{C_{tune}}}$$

As illustrated by this equation, the bimorph capacitor 72 can be dimensioned so that the tuning capacitance $C_{tune}$ at least partially compensates for changes in frequency that may occur in response to temperature fluctuations. For example, increases in temperature will result in a decrease in $C_{tune}$ as the opposing electrodes of the bimorph capacitor 72 move apart from each other. This decrease in $C_{tune}$ will operate to increase the resonant frequency of the device 70 and thereby compensate for the decreasing resonant frequency of the thin-film bulk acoustic resonator 74 caused by the materials within the resonator 74 having a negative TCF.

Figure 8A:
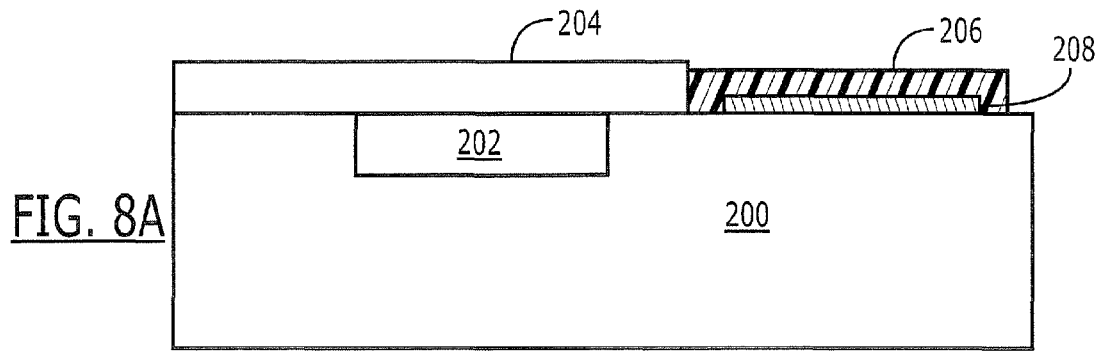
FIGS. 8A-8D are cross-sectional views of intermediate structures that illustrate methods of forming the micro-electromechanical device of FIG. 7A.

Referring now to FIGS. 8A-8D, methods of forming micro-electromechanical devices according to additional embodiments of the invention will be described. As illustrated by FIG. 8A, these methods include forming a semiconductor layer 204 (e.g., single crystal silicon layer) on a substrate 200 (e.g., silicon substrate) having a pre-formed recess 202 therein. This semiconductor layer 204 may be formed by bonding a silicon layer to a surface of a silicon wafer and then patterning the silicon layer to thereby expose a portion of the surface. A sequence of steps may then be performed to deposit a first metal layer (e.g., Al, Au, or Cu) on an exposed surface of the substrate 200, adjacent the semiconductor layer 204, and then photolithographically pattern the metal layer into a lower capacitor electrode 208.

Figure 8B:
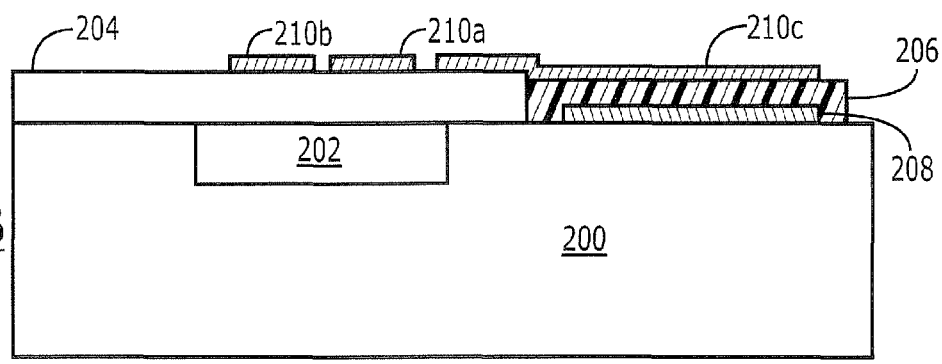

Referring still to FIG. 8A, an electrically insulating sacrificial layer 206 (e.g., photoresist, silicon dioxide, etc.) is then deposited on the lower capacitor electrode 208, at a location adjacent the semiconductor layer 204. As illustrated more fully hereinbelow with respect to FIG. 8D, the thickness of this sacrificial layer 206 determines an original spacing between opposing electrodes of a temperature-compensation capacitor ($C_{tune}$). Thereafter, as illustrated by FIG. 8B, a second metal layer (e.g., Al, Au, or Cu) is deposited on the semiconductor layer 204 and on the sacrificial layer 206. This second metal layer is then photolithographically patterned to define a resonator input electrode 210a, a resonator output electrode 210b and an upper capacitor electrode 210c, which can be electrically connected to the resonator input electrode 210a (or output electrode 210b).

Figure 8C:
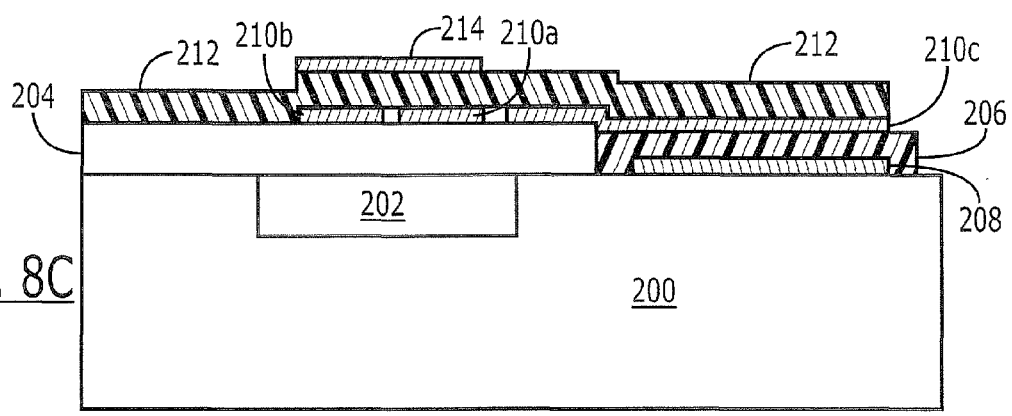

As shown in FIG. 8C, the semiconductor layer 204 and the electrodes 210a-210c are then covered by a piezoelectric layer 212 (e.g., AlN layer). Thereafter, a resonator reference electrode 214 (e.g., GND electrode) is formed on the piezoelectric layer 212, opposite the input and output electrodes 210a and 210b. This resonator reference electrode 214 may be formed by depositing a metal layer (e.g., Al, Cu or Au) on the piezoelectric layer 212 and then selectively patterning the metal layer. The piezoelectric layer 212 is also patterned for both the resonator and the bimorph capacitor, which contains a piezoelectric beam 212" suspended opposite the lower capacitor electrode 208.

Figure 8D:
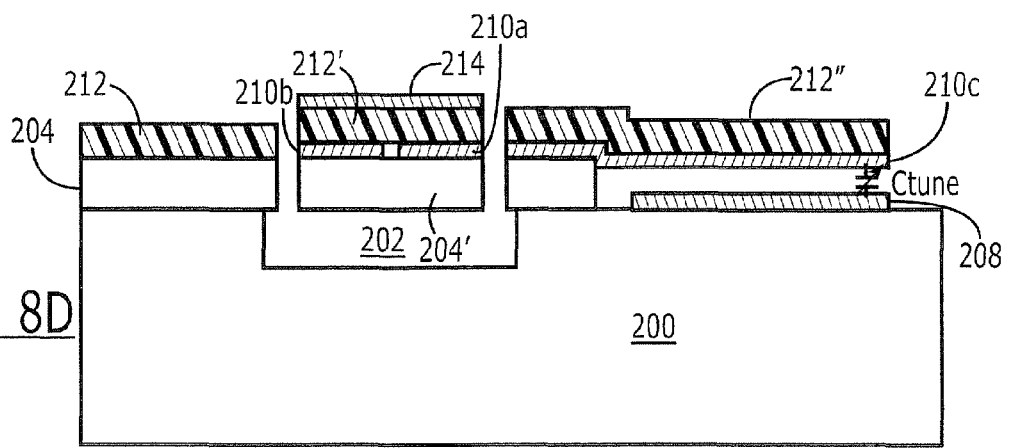

Referring now to FIG. 8D, the sacrificial layer 206 is then removed to release the upper capacitor electrode 210c and thereby define a bimorph beam, which includes a portion of the piezoelectric layer 212 and the upper capacitor electrode 210c. Thereafter, the piezoelectric layer 212 and the semiconductor layer 204 can be selectively patterned to define a resonator body that is suspended over the recess 202 in the underlying substrate 200. The resonator body is illustrated as including a suspended semiconductor region 204', input and output electrodes 210a and 210b, a patterned piezoelectric layer 212' and a reference electrode 214.

Figure 9A:
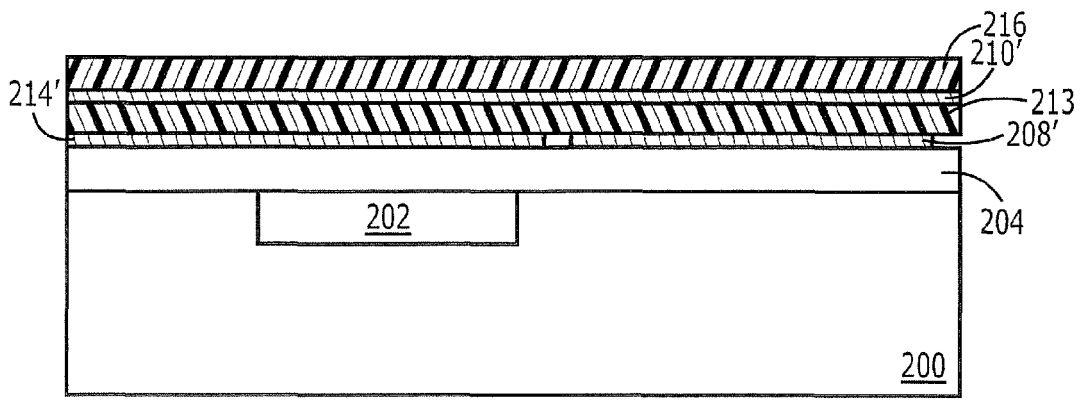
FIGS. 9A-9D are cross-sectional views of intermediate structures that illustrate alternative methods of forming the micro-electromechanical device of FIG. 7A.

Referring now to FIGS. 9A-9D, additional methods of forming micro-electromechanical devices according to embodiments of the invention include forming a semiconductor layer 204 (e.g., single crystal silicon layer) on a substrate 200 (e.g., silicon substrate) having a pre-formed recess 202 therein, as illustrated by FIG. 9A. This semiconductor layer 204 may be formed by bonding a silicon layer to a surface of a silicon wafer. A sequence of steps may then be performed to deposit a first metal layer (e.g., Al, Cu or Au) on the semiconductor layer 204, and then photolithographically pattern the metal layer into a lower capacitor electrode 208' and a reference electrode layer 214'. Another sequence of steps is then performed to deposit a composite stack of layers, including a piezoelectric layer 213 (e.g., AlN), an upper electrode layer 210' (e.g., Al, Au or Cu) and an electrically insulating layer 216 (e.g., SiO$_2$).

Figure 9B:
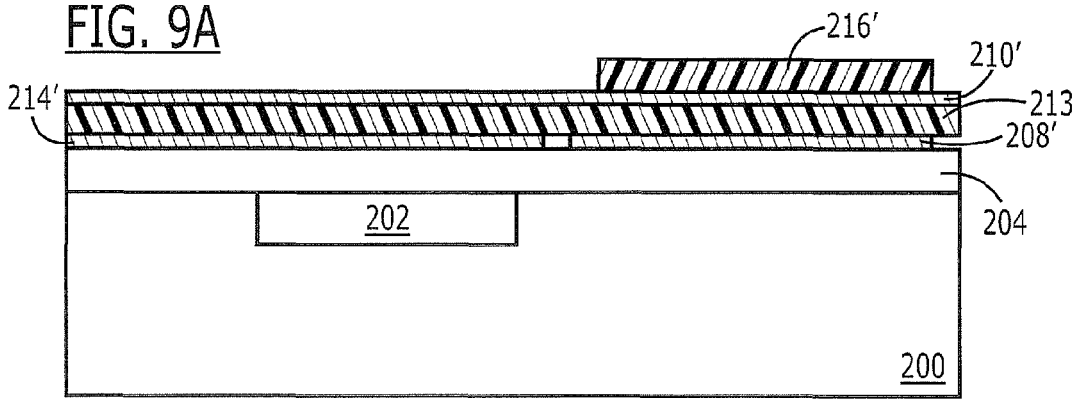
Figure 9C:
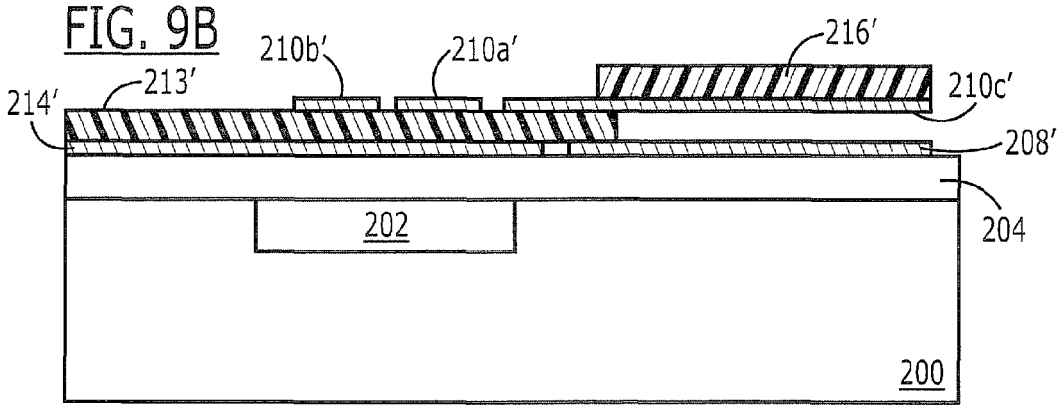

Thereafter, as illustrated by FIG. 9B, the electrically insulating layer 216 is patterned to define an electrically insulating pattern 216' to be used in a bimorph beam. FIG. 9C illustrates the patterning of the upper electrode layer 210' into an input electrode 210a' of a resonator, an output electrode 210b' of the resonator and an upper capacitor electrode 210c'. The bimorph beam containing the upper capacitor electrode 210c' and the electrically insulating pattern 216' is then released by selectively removing a portion of the piezoelectric layer 213 (e.g., using wet etching) to thereby define a patterned piezoelectric layer 213'.

Figure 9D:
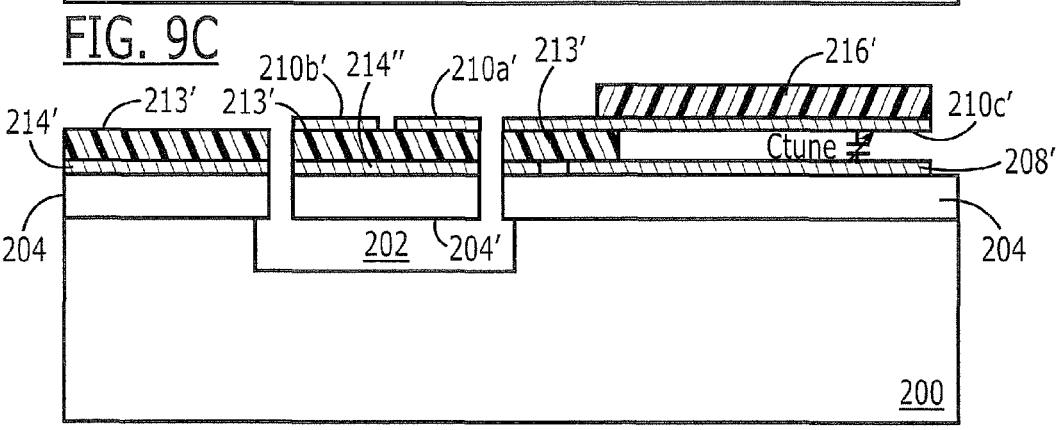

Thereafter, as illustrated by FIG. 9D, the patterned piezoelectric layer 213', the reference electrode layer 214' and the semiconductor layer 204 can be further patterned to define a suspended resonator body, which is illustrated as including a suspended semiconductor region 204', input and output electrodes 210a' and 210b', a patterned piezoelectric layer 213' and the reference electrode 214".

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A micro-electromechanical device, comprising:
   a temperature-compensation capacitor comprising:
      a bimorph beam having a first electrode thereon; and
      a second electrode extending opposite the first electrode; and
   a thin-film bulk acoustic resonator having a first terminal electrically coupled to the first or second electrode of said temperature-compensation capacitor;
   wherein said thin-film bulk acoustic resonator comprises a first piezoelectric layer and the bimorph beam comprises a second piezoelectric layer.

2. The device of claim 1, wherein said thin-film bulk acoustic resonator has a net negative temperature coefficient of frequency; and wherein the bimorph beam is configured to provide an increase in a spacing between the first and second electrodes of said temperature-compensation capacitor in response to an increase in temperature of the micro-electromechanical device and a decrease in the spacing in response to a decrease in the temperature.

3. The device of claim 1, wherein the first and second piezoelectric layers are coplanar relative to each other.

4. The device of claim 1, wherein said thin-film bulk acoustic resonator comprises a resonator body; and wherein the first terminal of said thin-film bulk acoustic resonator comprises a first electrode on said resonator body.

5. The device of claim 4, wherein the first electrode of said thin-film bulk acoustic resonator is coplanar with the first electrode of said temperature-compensation capacitor.

6. The device of claim 1, wherein the bimorph beam comprises first and second materials having different thermal coefficients of expansion.

7. A micro-electromechanical device, comprising:
   a thin-film bulk acoustic resonator having a negative temperature coefficient of frequency; and
   a temperature-compensation capacitor comprising a bimorph beam, electrically coupled in series with a terminal of said thin-film bulk acoustic resonator;
   wherein said thin-bulk acoustic resonator comprises a first piezoelectric layer and the bimorph beam comprises a second piezoelectric layer.

8. The device of claim 7, wherein said thin-film bulk acoustic resonator comprises an input electrode electrically coupled to an electrode of said temperature-compensation capacitor.

9. The device of claim 7, wherein the bimorph beam comprises first and second materials having different thermal coefficients of expansion.

10. A micro-electromechanical device, comprising:
    a thin-film bulk acoustic resonator comprising a first piezoelectric layer and first and second resonator electrodes adjacent the first piezoelectric layer; and
    a temperature-compensation capacitor comprising a first capacitor electrode, which is electrically coupled to the first resonator electrode, and a second capacitor electrode, said temperature-compensation capacitor configured to serially load said thin-film bulk acoustic resonator with an electrical impedance that varies in response to movement of a bimorph beam within said temperature-compensation capacitor, said movement of the bimorph beam providing passive compensation of temperature-based changes in resonant frequency of said thin-film bulk acoustic resonator by changing a spacing between the first and second capacitor electrodes in response to changes in temperature of the bimorph beam.

11. The device of claim 10, wherein the bimorph beam comprises a second piezoelectric layer.

12. The device of claim 11, where the first and second piezoelectric layers are coplanar with each other.

13. The device of claim 10, wherein the first resonator electrode is coplanar with the first capacitor electrode.

14. The device of claim 10, wherein the bimorph beam comprises first and second materials having different thermal coefficients of expansion.

15. The device of claim 14, wherein the spacing between the first and second capacitor electrodes increases in response to positive changes in temperature of the bimorph beam.

16. The device of claim 10, wherein said thin-film bulk acoustic resonator and said temperature-compensation capacitor collectively form a resonator circuit; and wherein the second resonator electrode operates as an input terminal of the resonator circuit and the second capacitor electrode operates as an output terminal of the resonator circuit, or vice versa.

17. A micro-electromechanical device, comprising:
    a thin-film bulk acoustic resonator comprising a first piezoelectric layer and first and second resonator electrodes adjacent the first piezoelectric layer; and
    a temperature-compensation capacitor electrically connected in series with the first resonator electrode, said temperature-compensation capacitor configured to load said thin-film bulk acoustic resonator with an electrical impedance that varies in response to movement of a bimorph beam within said temperature-compensation capacitor, which occurs in response to changes in temperature of the bimorph beam.

18. The device of claim 17, wherein the bimorph beam comprises a second piezoelectric layer.

19. The device of claim 17, wherein said thin-film bulk acoustic resonator and said temperature-compensation capacitor collectively form a resonator circuit; and wherein the second resonator electrode operates as an input terminal of the resonator circuit and an electrode of said temperature-compensation capacitor operates as an output terminal of the resonator circuit, or vice versa.

* * * * *